US006319836B1

(12) United States Patent
Dunton et al.

(10) Patent No.: US 6,319,836 B1
(45) Date of Patent: Nov. 20, 2001

(54) PLANARIZATION SYSTEM

(75) Inventors: Samuel V. Dunton, San Jose; Ming-Yi Lee, Fremont, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/669,979

(22) Filed: Sep. 26, 2000

(51) Int. Cl.[7] .................................................. H01L 21/302
(52) U.S. Cl. ............................................. 438/691; 451/41
(58) Field of Search ................................... 438/691, 697, 438/723, 743, 514, 561, 563, 565; 451/41

(56) References Cited

U.S. PATENT DOCUMENTS

| | | | |
|---|---|---|---|
| 5,492,858 | 2/1996 | Bose et al. | 437/67 |
| 5,502,007 | 3/1996 | Murase | 437/225 |
| 5,560,802 | 10/1996 | Chisholm | 156/636.1 |
| 5,629,242 | 5/1997 | Nagashima et al. | 438/692 |
| 5,816,900 | 10/1998 | Nagahara et al. | 451/285 |
| 5,835,226 | 11/1998 | Berman et al. | 356/382 |
| 5,863,825 | 1/1999 | Pasch et al. | 438/401 |
| 5,865,666 | 2/1999 | Nagahara | 451/10 |

(List continued on next page.)

OTHER PUBLICATIONS

V. Lim, F. Chen, W. Goh, L Chan, T. Ang, M. Zhou, "Dishing Reduction Using Polysilicon buffer STI–CMP Scheme," The Electrochemical Society 198th Meeting, Phoenix, AZ, Oct. 22–27, 2000.

S. Fen et al., "Analysis of a High Selectivity Polysilicon Slurry for Chemical Mechanical Polishing (CMP)," CMP–MIC Proceedings, Feb., 19–20, 1998, pp. 134–141.

Primary Examiner—David Nelms
Assistant Examiner—Quoc Hoang

(74) Attorney, Agent, or Firm—Luedeka, Neely & Graham, P.C.

(57) ABSTRACT

A method for planarizing an integrated circuit. The integrated circuit is to be planarized to an upper surface using chemical mechanical polishing. The upper surface of the integrated circuit includes regions of a first material and regions of a second material. The first material has a first polishing rate and desired chemical, physical, and electrical properties. The second material has a second polishing rate and desired chemical, physical, and electrical properties. The first polishing rate is greater than the second polishing rate. The regions of the first material adjoin the regions of the second material at interfaces. The upper surface of the integrated circuit is overlaid with a top layer of the second material, that is to be removed by the chemical mechanical polishing. Both the regions of the second material and the top layer of the second material are deposited during a deposition. The upper surface of the integrated circuit tends to form deleterious tapers at the interfaces between the first material and the second material when the chemical mechanical polishing is taken past a desired end point. The improvement comprises modifying the second material to increase the second polishing rate by adding a dopant to the second material prior to planarizing the integrated circuit. The dopant does not significantly adversely affect either the desired chemical, physical, and electrical properties of the second material, or the desired chemical, physical, and electrical properties of the first material. Thus, by modifying the second polishing rate of the second material, the difference in polishing rates between the first material and the second material is reduced, and the deleterious tapers in the top surface, which are caused at least in part by over polishing a surface that has regions of different materials that have different polishing rates, tend to be eliminated or dramatically reduced, depending at least in part upon how closely the second polishing rate is matched to the first polishing rate by the modification of the second material.

19 Claims, 3 Drawing Sheets

U.S. PATENT DOCUMENTS

| | | | |
|---|---|---|---|
| 5,868,608 | 2/1999 | Allman et al. | 451/72 |
| 5,882,251 | 3/1999 | Berman et al. | 451/527 |
| 5,888,120 | 3/1999 | Doran | 451/41 |
| 5,893,756 | 4/1999 | Berman et al. | 438/692 |
| 5,928,959 * | 7/1999 | Huckels et al. | 438/691 |
| 5,931,719 | 8/1999 | Nagahara et al. | 451/41 |
| 5,941,761 | 8/1999 | Nagahara et al. | 451/56 |
| 5,944,585 | 8/1999 | Nagahara et al. | 451/56 |
| 5,953,612 | 9/1999 | Lin et al. | 438/299 |
| 5,957,757 | 9/1999 | Berman | 451/56 |
| 5,961,375 | 10/1999 | Nagahara et al. | 451/41 |
| 5,985,679 | 11/1999 | Berman | 438/7 |
| 5,990,010 | 11/1999 | Berman | 438/691 |
| 6,057,211 * | 5/2000 | Schwalke | 438/428 |
| 6,066,266 | 5/2000 | Osugi et al. | 216/85 |
| 6,069,085 | 5/2000 | Berman | 438/697 |
| 6,071,818 | 6/2000 | Chisholm et al. | 438/692 |
| 6,074,288 | 6/2000 | Nagahara et al. | 451/384 |
| 6,074,517 | 6/2000 | Taravade | 156/345 |
| 6,077,783 | 6/2000 | Allman et al. | 438/691 |
| 6,080,670 | 6/2000 | Miller et al. | 438/691 |
| 6,200,896 * | 3/2001 | Sethuraman et al. | 438/691 |

* cited by examiner

PLANARIZATION SYSTEM

FIELD

This invention relates to the field of integrated circuit processing. More particularly the invention relates to a method for planarizing layers of an integrated circuit.

BACKGROUND

There is continual pressure for integrated circuits to be increasingly faster and increasingly more powerful. Both of these objectives tend to be influenced by the size of the integrated circuits. By fabricating smaller integrated circuits, electrical pathways are shorter and more devices are formed within a given space, which tends to result in a faster, more powerful integrated circuit.

As the size of devices is reduced, it is increasingly difficult to adequately fill and cover the devices with the successive layers of material from which the devices are formed. This is because the small feature size tends to produce surfaces that are extremely uneven. If the extremely uneven surfaces are not modified in some manner, then the overlying layers of material tend to suffer from a variety of problems, such as not conforming to the underlying surface in a uniform manner, forming pinholes and cracks either during deposition or during subsequent processing, and cracking from unbalanced and unalleviated stresses.

These problems, and others, are reduced in large measure by planarizing in some manner an existing underlying surface of an integrated device after it is formed and before an overlying layer is deposited. One method of planarizing is chemical mechanical polishing. During chemical mechanical polishing, the face of the substrate in process is held against a rotating polishing pad by an end effector that contacts the back of the substrate. The end effector may also be rotating and translating the substrate over the surface of the polishing pad. Typically, a slurry of some sort, such as water, aqueous etchants, or a polishing rouge is present on the pad to aid in the polishing action.

As the abrasion between the substrate surface and the pad occurs, material is removed from the surface of the substrate. The material removed from the surface of the substrate is removed at a rate that is dependent upon several factors, such as the speed of the pad, the type of etchant or rouge that is used in the process, and the specific characteristics of the materials which comprise the surface being polished away in the chemical mechanical polishing process. Therefore, even with all other variables held constant, different types of materials tend to have different chemical mechanical polishing rates.

For example, if a surface that is being polished has regions of two different materials, one of the materials may have a polishing rate that is greater than the polishing rate of the other material. In this case, the regions of the surface that are formed of the material with the greater polishing rate will tend to erode at a faster rate than the regions that are formed of the material with the slower polishing rate. When this happens, the thickness of the surface decreases faster in the high polishing rate regions and the thickness of the surface decreases slower in the low polishing rate regions. This difference in the rate at which the thickness of the surface decreases tends to cause a surface defect at the interface between the regions with different polishing rates. This surface defect tends to resemble a taper at the interface between the higher polishing rate region and the lower polishing rate region, where the region with the lower polishing rate is at a higher level than the region with the higher polishing rate.

As the very purpose for performing the chemical mechanical polishing process is to reduce and planarize the topographical features of the surface being polished, the taper surface defect is viewed as a deleterious anomaly in the polished surface, and is not desired. However, the design goal of elimination of the deleterious taper is in competition with the design goal of forming surfaces that have regions formed of different materials, some of which may have different polishing rates.

What is needed, therefore, is a system for planarizing the surface of an integrated circuit that reduces or eliminates the deleterious taper that forms between regions of the surface that are formed of materials that have different polishing rates.

SUMMARY

The above and other needs are met by an improvement to a method for planarizing an integrated circuit. The integrated circuit is to be planarized to an upper surface using chemical mechanical polishing. The upper surface of the integrated circuit includes regions of a first material and regions of a second material. The first material has a first polishing rate and desired chemical, physical, and electrical properties. The second material has a second polishing rate and desired chemical, physical, and electrical properties. The first polishing rate is greater than the second polishing rate. The regions of the first material adjoin the regions of the second material at interfaces. The upper surface of the integrated circuit is overlaid with a top layer of the second material, that is to be removed by the chemical mechanical polishing. Both the regions of the second material and the top layer of the second material are deposited during a deposition. The upper surface of the integrated circuit tends to form deleterious tapers at the interfaces between the first material and the second material when the chemical mechanical polishing is taken past a desired end point.

The improvement comprises modifying the second material to increase the second polishing rate of the second material by adding a dopant to the second material prior to planarizing the integrated circuit. The dopant does not significantly adversely affect either the desired chemical, physical, and electrical properties of the second material, or the desired chemical, physical, and electrical properties of the first material.

Thus, by modifying the second polishing rate of the second material, the difference in polishing rates between the first material and the second material is reduced, and the deleterious tapers in the top surface, which are caused at least in part by over polishing a surface that has regions of different materials that have different polishing rates, tend to be eliminated or dramatically reduced, depending at least in part upon how closely the second polishing rate is matched to the first polishing rate by the modification of the second material.

In various preferred embodiments of the invention, the first material is monocrystalline silicon, the second material is silicon oxide, and the dopant is phosphorous. Modifying the silicon oxide in this manner preferably converts the silicon oxide to phosphosilicate glass. The dopant is preferably added to the second material to a concentration of between about 0.5 weight percent and about ten weight percent, and most preferably about three weight percent. In a most preferred embodiment, the dopant is added to the second material during the deposition of the second material, such as during a high density plasma deposition. Most preferably, the second polishing rate of the second material is modified to be substantially equal to the first polishing rate of the first material.

According to another aspect of the invention, an improved integrated circuit is provided on a monocrystalline silicon substrate. The improvement comprises isolation structures of phosphosilicate glass, where the monocrystalline silicon substrate has a first polishing rate and the phosphosilicate glass isolation structures have a second polishing rate, and the first polishing rate is substantially equal to the second polishing rate. Structures of other material, such as polysilicon or amorphous silicon are also comprehended.

BRIEF DESCRIPTION OF THE DRAWINGS

Further advantages of the invention are apparent by reference to the detailed description when considered in conjunction with the following figures, which are not to scale so as to more clearly show the details, wherein like reference numbers refer to like elements within the several views, and wherein.

DETAILED DESCRIPTION

Figure 1:
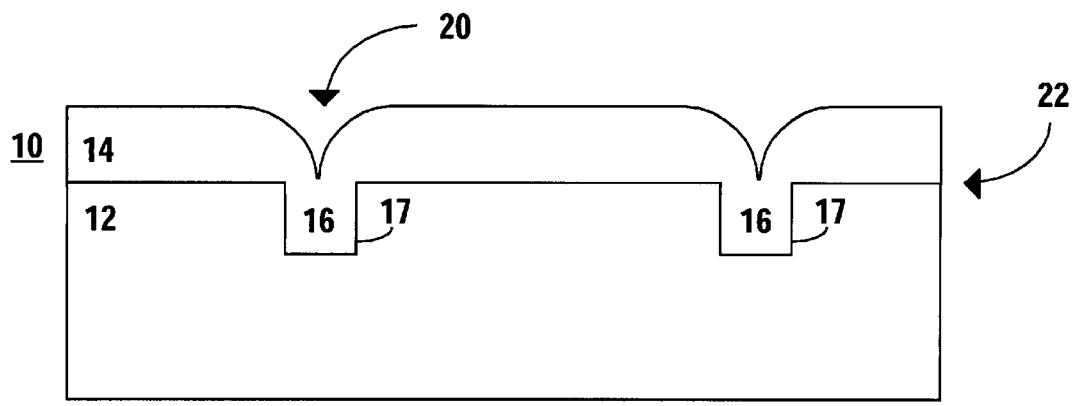
FIG. 1 is a cross sectional view of a first embodiment of an integrated circuit to be planarized.

Referring now to FIG. 1, there is depicted a substrate 12, upon which an integrated circuit 10 is to be formed. The example of FIG. 1 depicts the integrated circuit 10 at a very early level of processing, before most of the major elements of the integrated circuit have been formed. At this point in the processing of the integrated circuit 10, isolation structures 16 have been depositing within channels or trenches 17 that have been etched into the substrate 12. As depicted in FIG. 1, the material in the isolation structures 16 has been co-deposited as a part of an upper layer 14 of the same material as the isolation structures 16. The deposition of the material of the upper layer 14 into the isolation structures 16 tends to create surface anomalies, such as depression 20. It is desired to planarize the integrated circuit 10 to the level of what will be the upper surface 22, when the planarization process is complete.

As described in the detailed description below, a specific extended example of an embodiment of the invention is presented. However, it is appreciated that the extended example is merely representational of the various embodiments of the invention, and that in various embodiments the invention is applied to a wide range of different processes and devices. For example, as described both above and below, this embodiment of the invention is applied to the planarization of the isolation structures 16 in the integrated circuit 10. In other embodiments, the invention is applied to the planarization of other structures as well. Further, as described below, this embodiment of the invention is applied to chemical mechanical planarization. In other embodiments, the invention is applied to other forms of planarization as well. Thus, the interpretation of the breadth of the invention should not be limited merely because of the specific example that is given below.

In a most preferred embodiment, the substrate 12 is a monocrystalline silicon substrate. The substrate 12 may have already received implanted wells at this point in the processing, and perhaps other implanted structures as well. However, all such prior processing or post processing is substantially incidental to the application of the present invention. The isolation structures 16 and the top layer 14 are preferably silicon oxide. Because silicon oxide is a relatively electrically non-conductive material, it tends to be a preferred material for forming the isolation structures 16. Further, silicon and silicon oxide each have other specific physical, chemical, and electrical properties that are desired for the various devices that will be formed in the integrated circuit 10. It is preferred that nothing be done to significantly adversely affect these physical, chemical, and electrical properties of either the substrate 10 or the isolation structures 16, or else the completed integrated circuit 10 may not function properly or reliably.

Figure 2:
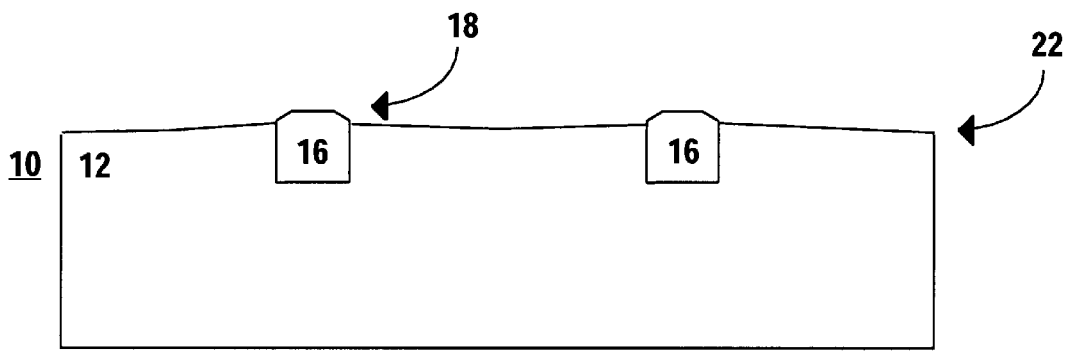
FIG. 2 is a cross sectional view of a prior art planarized first embodiment integrated circuit, where the planarization process has formed tapers at the interfaces between the different regions of the surface.

FIG. 2 depicts the integrated circuit 10 after it has been planarized to the level of the upper surface 22, without application of the present invention. Because the material that is used to form the isolation structures 16, in this example silicon oxide, has a lower polishing rate than the material that is used to form the substrate 12, in this example silicon, once portions of the top layer 14 are removed from over the substrate 12, the substrate 12 tends to wear away during chemical mechanical polishing at a relatively faster rate than other portions of the top layer 14 that may still be on top of the substrate 12, due to uneven erosion of the top layer 14, which is caused by a variety of factors, both known and unknown.

For example, the top layer 14 may not have exactly the same thickness at all positions where it overlies the substrate 12. Thus the top layer 14 will be completely removed in some areas over the substrate 12 at the same time that it still exists over other areas of the substrate 12. Because all of the top layer 14 is preferably removed, the chemical mechanical polishing of the integrated circuit 10 continues to that point. However, in those areas of the integrated circuit 10 where the top layer 14 has already been removed, the polishing begins to erode the material from the substrate 12, which has been exposed below the top layer 14, and to also erode the material from the isolation structures 16. As described above, the isolation structures 16 and the substrate 12 have different polishing rates, and thus the problems described above are encountered. This general situation is typically referred to as over-polishing of the integrated circuit 10, which means that the polishing process must be performed to a point that is past that point which is desired for some parts of the integrated circuit 10, where the top layer 14 is removed earlier than it is from other parts of the integrated circuit 10.

Monocrystalline silicon, such as that used to form the substrate 12, typically has a polishing rate of between about 48 angstroms per second and about 56 angstroms per second when subjected to a typical chemical mechanical polishing process. However, silicon oxide, such as that used to form the top layer 14 and the isolation structures 16, typically has a polishing rate of between about 35 angstroms per second and about 40 angstroms per second when subjected to a typical chemical mechanical polishing process. Thus, it is evident that there will typically be a discrepancy between the rate at which the two different materials are removed from a surface, such as the upper surface 22. The monocrystalline silicon substrate 12 tends to erode faster, while the silicon oxide isolation structures 16 tend to erode more slowly.

As previously described, the discrepancy between the polishing rate for the silicon substrate 12 and the polishing rate for the silicon oxide isolation structure 16 tends to form a deleterious taper 18 at the interfaces between the silicon substrate 12 and the silicon oxide isolation structure 16. The taper 18 tends to be a slope from a lower level of the silicon substrate 12, representing the material with the higher polishing rate, to an upper level of the silicon oxide isolation structure 16, representing the material with the lower polishing rate. In actual practice, the various tapers 18 across the upper surface 22 of the integrated circuit 10 include tapers with various angles of slope.

As mentioned above, it is the purpose of the planarization process to remove, to the greatest extent possible, all surface topography defects such as the taper 18. Obviously, by causing the tapers 18, the-planarization of the integrated circuit 10 has failed at least in part in the realization of that purpose. Thus, the various embodiments of the invention as presented herein are applied to inhibit, at least in part, the formation of surface anomalies such as the taper 18, and thus help to more fully realize the objectives in planarizing the upper surface 22 of the integrated circuit 10.

This improvement is realized by modifying at least the material of the isolation structures 16 so that the polishing rate of the isolation structures 16 more nearly matches, and most preferably is substantially equal to, the polishing rate of the substrate 12. In this manner, the silicon material of the substrate 12 is removed from the upper surface 22 at a rate that more nearly matches that at which the silicon oxide material of the isolation structures 16 is removed from the upper surface 22. Thus, the discrepancy between the polishing rates is reduced and, therefore, the degree to which the deleterious tapers 18 are formed is commensurately reduced.

Figure 3:
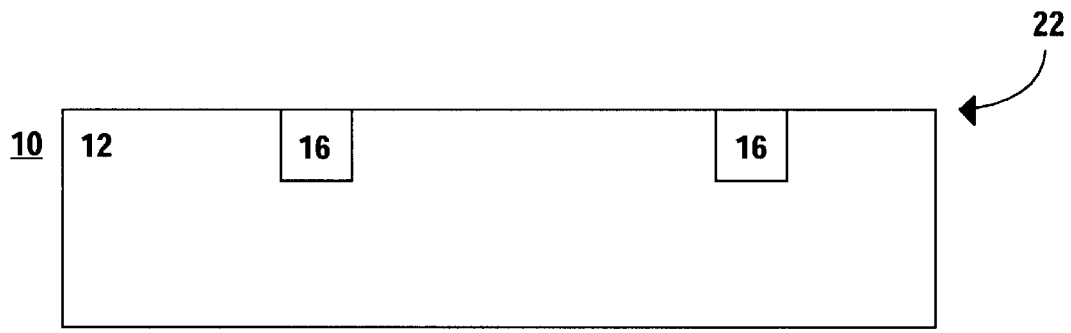
FIG. 3 is a cross sectional view of a planarized first embodiment integrated circuit, where the planarization process has not formed tapers at the interfaces between the different regions of the surface.
Figure 4:
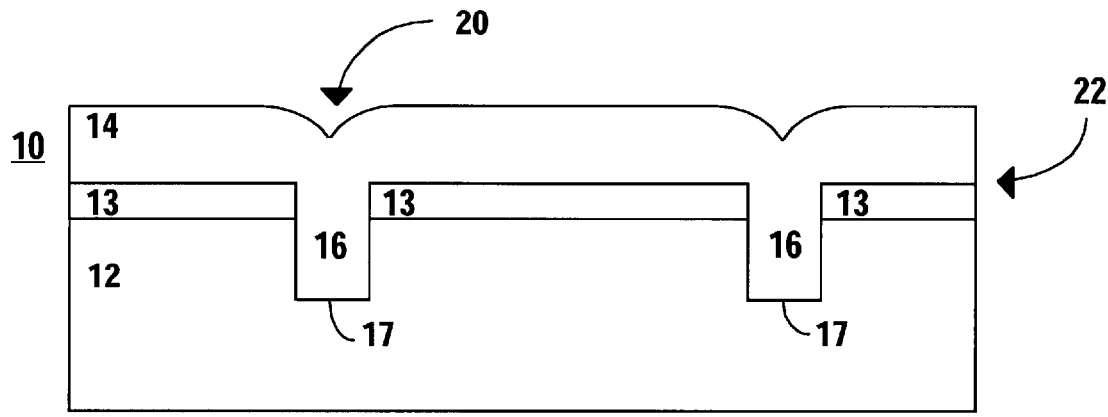
FIG. 4 is a cross sectional view of a second embodiment of an integrated circuit to be planarized.

FIG. 3 depicts the upper surface 22 of the integrated circuit 10 after planarization, when the improvement of the present invention has been applied, and the material of the isolation structures 16 has been modified to have a polishing rate that more nearly matches the polishing rate of the material of the substrate 12. As depicted in FIG. 3, the upper surface 22 has a far more even and uniform topography, and thus the goal of planarization the upper surface 22 has been more fully realized. Further, application of the present invention provides that additional layers deposited on top of the upper surface 22 will also be more fully planarized, as the deleterious tapers 18, or notches 18 as described more completely below, are not translated into the topography of the overlying layers. Thus, application of the present invention benefits not only the immediate surface 22 being planarized, but subsequently deposited layers as well.

The material of the isolation structures 16 is preferably modified by the addition of a dopant that effects the polishing rate of the material of the isolation structures 16. The material of the isolation structures 16 is modified by addition of the dopant at any one or more different points in time. For example, in one embodiment the material of the isolation structures 16 is modified after it is deposited, by introducing the dopant to the material of the isolation structures 16, such as by a diffusion process in a furnace or by ion implantation process. However, in more preferred embodiments the dopant is introduced to the material of the isolation structures 16 during the deposition of the material of the isolation structures 16.

For example, if the material of the isolation structures 16 is formed by a high density plasma deposition process, then in one embodiment the dopant is introduced during the deposition as a flow of a gas containing the dopant. Alternately, if the material of the isolation structures 16 is formed by a different process, such as by a chemical vapor deposition process such as atmospheric pressure chemical vapor deposition, low pressure chemical vapor deposition, plasma enhanced chemical vapor deposition, or sub atmospheric chemical vapor deposition, then in another embodiment the dopant is similarly introduced during the deposition process as a flow of a gas containing the dopant.

In the preferred embodiment, where the material of the substrate 12 is monocrystalline silicon and the material of the isolation structures 16 is silicon oxide, the dopant is most preferably phosphorous, or a related material such as boron. In a most preferred embodiment, the phosphorous dopant is introduced and incorporated into the material of the isolation structures 16 to a concentration of between about 0.5 weight percent and about ten weight percent, and most preferably about three weight percent. At these concentrations, the silicon oxide material of the isolation structures 16 is preferably substantially converted from silicon oxide to phosphosilicate glass. After such modification to the material of the isolation structures 16, the polishing rate of the material of the isolation structures 16 is preferably between about 48 angstroms per second and about 56 angstroms per second.

Different concentrations of the dopant are used to modify the polishing rate of the material of the isolation structures 16 as desired. For example, the polishing rate of the material of the isolation structures 16 is in different embodiments adjusted to be greater than, less than, or substantially equal to the polishing rate of the material of the substrate 12. Further, in an embodiment where the material of the isolation structures 16 has a polishing rate that is greater than the material of the substrate 12, a dopant is added to the material of the isolation structures 16 that tends to decrease the polishing rate of the material of the isolation structures 16, which again is preferably tailored to more nearly match the polishing rate of the material of the substrate 12, whether the final polishing rate of the one material be slightly greater than, slightly less than, or substantially equal to the other polishing rate of the other material.

It is preferred that the dopant used to modify the material of the isolation structures 16 not be of a species that significantly adversely effects the physical, chemical, or electrical properties of either the material of the substrate 12 or the material of the isolation structures 16. Further, it is similarly preferred that the concentration of the dopant used to modify the material of the isolation structures 16 not be at a level that significantly adversely effects the physical, chemical, or electrical properties of either the material of the substrate 12 or the material of the isolation structures 16.

In the example given above, phosphorous in the concentration range given does not tend to significantly adversely effect the physical, chemical, or electrical properties of either the material of the substrate 12 or the material of the isolation structures 16. For example, at the concentrations give, the phosphorous dopant does not tend to diffuse out of the silicon oxide isolation structures 16 and into the monocrystalline silicon substrate 12 to a degree where it significantly adversely effects the semiconducting profile of the monocrystalline silicon substrate 12 and alters the functioning of the various devices formed in the integrated circuit 10.

Further, although the phosphorous dopant obviously effects the physical characteristics of the material of the isolation structure 16 by altering the polishing rate of the material of the isolation structure 16, the phosphorous dopant in the concentrations given above does not tend to significantly adversely effect the other desired physical properties of the material of the isolation structure 16, or the other desired properties of the material of the isolation structure 16, such as the electrical insulating properties of the material of the isolation structure 16.

There are a few considerations in regard to not significantly adversely effecting the physical, chemical, or electrical properties of either the material of the substrate 12 or the material of the isolation structures 16, as mentioned at various points above. For the specific example of using phosphorous to modify silicon oxide isolation structures 16, the essential physical, chemical, or electrical properties of both the material of the substrate 12 and the material of the isolation structures 16 can be more fully maintained by completely oxidizing the phosphorous to its pentavalent oxidation state, $P_2O_5$, which tends to immobilize the phosphorous in the oxide matrix. Further, if a trench isolation liner of a material such as silicon oxide or silicon nitride is used between the modified silicon oxide of the isolation structure 16 and the surrounding monocrystalline silicon substrate 12, then the liner layer further helps to inhibit any significant adverse modification of the physical, chemical, or electrical properties of the material of the substrate 12.

Figure 5:
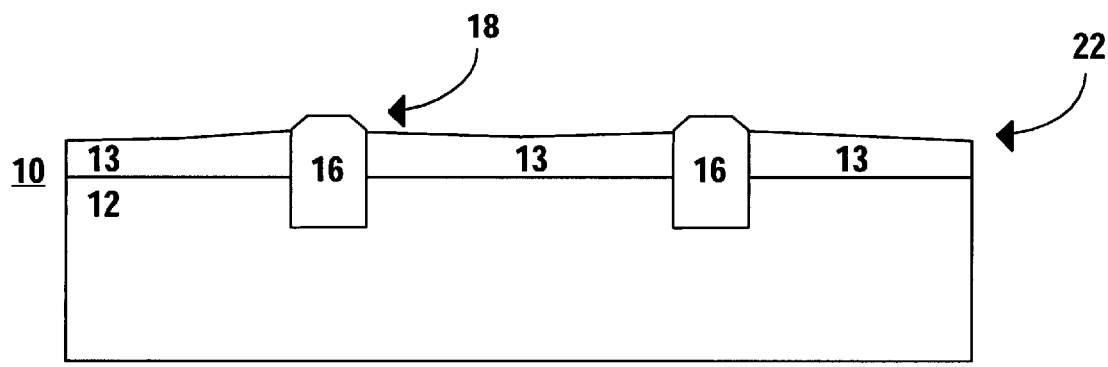
FIG. 5 is a cross sectional view of a prior art planarized second embodiment integrated circuit, where the planarization process has formed tapers at the interfaces between the different regions of the surface.
Figure 6:
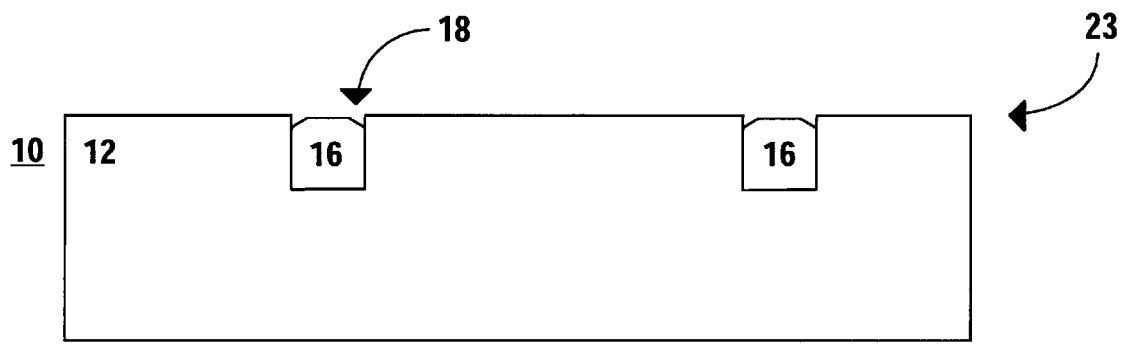
FIG. 6 is a cross sectional view of a prior art planarized second embodiment integrated circuit, where the tapers at the interfaces between the different regions of the surface have been translated down to notches.

In a second embodiment of the invention, an overlying layer 14 is to be planarized to an upper surface 22, comprised of regions of a material having a relatively higher polishing rate 13 and a material having a relatively lower polishing rate 14, which are disposed in structures 16 within trenches 17. In a manner as previously described above, without benefit of the modification according to the present invention, planarization down to the upper surface 22 tends to produce the deleterious tapers 18 as depicted in FIG. 5. When the layer 13 is removed and the structures 16 are etched down to substantially the underlying surface 23, the deleterious tapers 18 are translated down in the structures 16, and form deleterious notches 18 within the surface 23. Thus, in this second embodiment, as well as in the first embodiment described above, the planarization process has failed in its primary purpose of planarizing the resultant surface of the integrated circuit 10.

Figure 7:
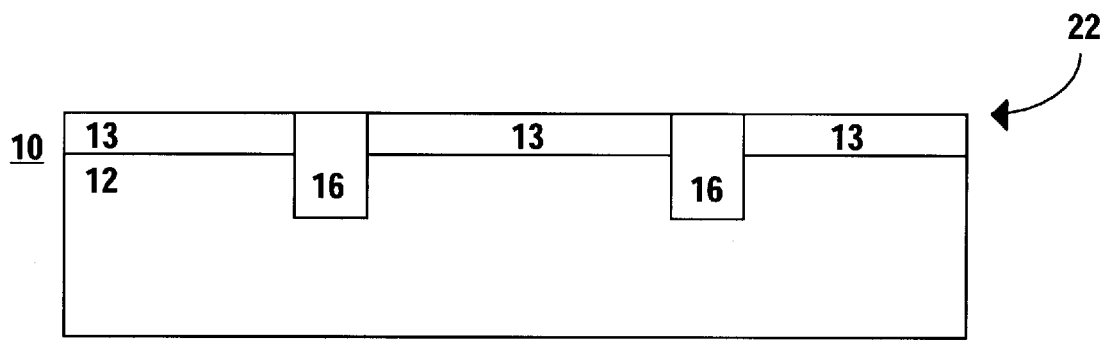
FIG. 7 is a cross sectional view of a planarized second embodiment integrated circuit, where the planarization process has not formed tapers at the interfaces between the different regions of the surface.
Figure 8:
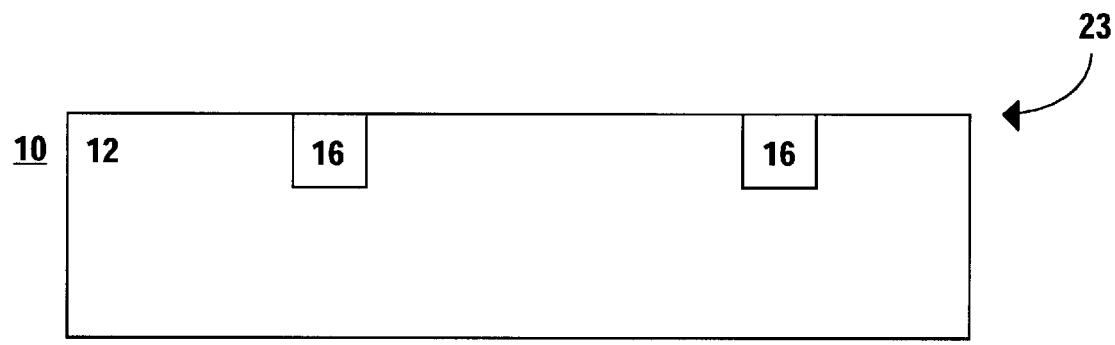
FIG. 8 is a cross sectional view of a planarized second embodiment integrated circuit, where the planarized interfaces between the different regions of the surface have been translated down to a second planarized surface.

In the embodiment depicted in FIG. 7, where the structures 16 have been modified according to the present invention, as explained at greater length above, the polishing rate of the material of layer 13 more nearly matches the polishing rate of the material of the structures 16, and thus the deleterious tapers 18 tend to not be formed at the upper surface 22. Further, when the layer 13 is removed and the structures 16 are etched down to the level of the underlying surface 23, notches 18 tend to not be formed because there tended to be no tapers 18 in the structures 16. In this second embodiment, the layer 13 may be, for example, a layer of amorphous silicon or polysilicon, or further may be a stacked layer of two or more different materials, such as polysilicon over silicon nitride.

Structures such as these described in this second embodiment may be used, for example, in microelectromechanical structures, which typically use oxide chemical mechanical polishing to polish down to a polysilicon microelectromechanical structure feature that is surrounded by oxide. In such applications a notched edge 18 translated into the top surface of a new layer deposited over the underlying surface 23, as described above, may be undesirable.

Thus, an integrated circuit 10 formed according to a preferred method of the invention, as described above, is physically distinguishable from other prior art integrated circuits, because the integrated circuit 10 formed according to the present invention have structures having a concentration of a dopant within the material of the structures, instead of structures formed of the pure material traditionally used in prior art integrated circuits. The integrated circuits 10 formed according to the present invention are also further physically distinguishable from prior art integrated circuits, because the integrated circuits 10 formed according to the present invention have at least a reduction if not an elimination of the number of deleterious tapers and notches 18 and of the degree of the deleterious tapers and notches 18 in the planarized surfaces 22 of the integrated circuits 10.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for planarizing an integrated circuit to an upper surface using chemical mechanical polishing where the upper surface of the integrated circuit includes regions of a first material having a first polishing rate and desired chemical, physical, and electrical properties, and regions of a second material having a second polishing rate and desired chemical, physical, and electrical properties, where the first polishing rate is greater than the second polishing rate, and the regions of the first material adjoin the regions of the second material at interfaces, and the upper surface of the integrated circuit is overlaid with a top layer of the second material to be removed by the chemical mechanical polishing, and the regions of the second material and the top layer of the second material are deposited during a deposition, and the upper surface of the integrated circuit tends to form deleterious tapers at the interfaces between the first material and the second material when the chemical mechanical polishing is taken past a desired end point, the improvement comprising modifying the second material to increase the second polishing rate by adding a dopant to the second material prior to planarizing the integrated circuit, where the modified second material is effective to avoid formation of the deleterious tapers at the interfaces between the first material and the modified second material, and wherein the dopant does not significantly adversely affect the desired chemical, physical, and electrical properties of the second material or the desired chemical, physical, and electrical properties of the first material.

2. The method of claim 1 wherein the first material is monocrystalline silicon.

3. The method of claim 1 wherein the second material is silicon oxide.

4. The method of claim 1 wherein the second material is polysilicon.

5. The method of claim 1 wherein the dopant is phosphorous.

6. The method of claim 1 wherein the dopant is boron.

7. The method of claim 1 wherein the second material is silicon oxide and the addition of the dopant to the silicon oxide converts the silicon oxide to phosphosilicate glass.

8. The method of claim 1 wherein the dopant is added to the second material to a concentration of between about 0.5 weight percent and about ten weight percent.

9. The method of claim 1 wherein the step of adding the dopant to the second material further comprises adding the dopant to the second material during the deposition of the second material.

10. The method of claim 1 wherein the step of adding the dopant to the second material further comprises adding the dopant to the second material by introducing a flow of the dopant during a high density plasma deposition of the second material.

11. The method of claim 1 wherein the step of adding the dopant to the second material further comprises adding the dopant to the second material by introducing a flow of the dopant during a chemical vapor deposition of the second material.

12. The method of claim 1 wherein the step of adding the dopant to the second material further comprises adding the dopant to the second material after the deposition of the second material.

13. The method of claim 1 wherein the step of modifying the second material further comprises modifying the second polishing rate of the second material to be substantially equal to the first polishing rate.

14. The method of claim 1 wherein the step of modifying the second material further comprises modifying the second polishing rate of the second material to be greater than the first polishing rate.

15. The method of claim 1 wherein the first polishing rate is between about 48 angstroms per second and about 56 angstroms per second, the second polishing rate prior to the modification of the second material is between about 35 angstroms per second and about 40 angstroms per second, and the second polishing rate after the modification of the second material is between about 48 angstroms per second and about 56 angstroms per second.

16. In a method for planarizing an integrated circuit to an upper surface using chemical mechanical polishing where the upper surface of the integrated circuit includes regions of monocrystalline silicon having a first polishing rate and desired chemical, physical, and electrical properties, and isolation structures of silicon oxide having a second polishing rate and desired chemical, physical, and electrical properties, where the first polishing rate is greater than the second polishing rate, and the regions of the monocrystalline silicon adjoin the isolation structures of the silicon oxide at interfaces, and the upper surface of the integrated circuit is overlaid with a top layer of the silicon oxide to be removed by the chemical mechanical polishing, and the isolation structures of the silicon oxide and the top layer of the silicon oxide are deposited during a deposition, and the upper surface of the integrated circuit tends to form deleterious tapers at the interfaces between the monocrystalline silicon and the silicon oxide when the chemical mechanical polishing is taken past a desired end point, the improvement comprising modifying the silicon oxide to increase the second polishing rate by adding a dopant to the silicon oxide prior to planarizing the integrated circuit, where the dopant is effective to avoid formation of the deleterious tapers at the interfaces between the monocrystalline silicon and the modified silicon oxide during the chemical mechanical polishing and wherein the dopant does not significantly adversely affect the desired chemical, physical, and electrical properties of the silicon oxide or the desired chemical, physical, and electrical properties of the monocrystalline silicon.

17. The method of claim 16 wherein the addition of the dopant to the silicon oxide converts the silicon oxide to phosphosilicate glass.

18. The method of claim 17 wherein the dopant is added to the silicon oxide to a concentration of between about 0.5 weight percent and about ten weight percent.

19. The method of claim 1 wherein the step of adding the dopant to the silicon oxide further comprises adding the dopant to the silicon oxide during the deposition of the silicon oxide.

* * * * *